United States Patent [19]
Huang

[11] Patent Number: 6,087,189
[45] Date of Patent: Jul. 11, 2000

[54] TEST STRUCTURE FOR MONITORING OVERETCHING OF SILICIDE DURING CONTACT OPENING

[75] Inventor: Tiao-Yuan Huang, Hsinchu, Taiwan

[73] Assignee: National Science Council, Taipei, Taiwan

[21] Appl. No.: 08/847,513

[22] Filed: Apr. 24, 1997

[51] Int. Cl.[7] .............................. H01L 21/302
[52] U.S. Cl. ..................... 438/10; 438/721; 438/13
[58] Field of Search ........................... 438/10, 11, 12, 438/13, 721; 422/10

[56] References Cited

U.S. PATENT DOCUMENTS

| | | | |
|---|---|---|---|
| 5,362,356 | 11/1994 | Schoenborn | 216/60 |
| 5,450,205 | 9/1995 | Sawin et al. | 216/60 X |
| 5,552,718 | 9/1996 | Bruce et al. | 324/765 |

*Primary Examiner*—William A. Powell
*Assistant Examiner*—George Goudreau
*Attorney, Agent, or Firm*—Jacobson, Price, Holman & Stern, PLLC

[57] ABSTRACT

For the contact opening in advanced IC processing, it becomes critical to monitor the degree of overetching of the thin silicide layer and also to obtain the etching rate of the silicide layer. A method is disclosed which will allow the electrical measurements of the sheet resistance of the exposed (by the contact etch) silicide layer, thus allowing electrical measurements to the integrity as well as the thickness of the remaining silicide layer. A main feature of the disclosed test method is a modification of the conventional van der Pauw test structure, or of the cross-bridge structure (which will allow electrical measurement of the line width, in addition to the sheet resistance information). Contrary to the conventional van der Pauw structure or cross-bridge structure where the contact opening pattern is designed to expose only the specific areas needed for allowing electrical connection to the four measurement pads, the contact opening mask is designed to expose some or all of the van der Pauw or cross-bridge structure, thus allowing the electrical measurement of the degree of silicide overetching during contact opening. The disclosed test method and corresponding structure can be applied as an on-wafer process monitor tool following the complete normal process flow, thus serving as a convenient on-wafer monitor.

3 Claims, 4 Drawing Sheets

TEST STRUCTURE FOR MONITORING OVERETCHING OF SILICIDE DURING CONTACT OPENING

TECHNIQUE SCOPE

To prevent the degradation of the transistor's electrical performance caused by parasitic resistors in the source/drain sector, silicidation of source/drain is commonly applied during the production of down-sizing micro-chip. Generally, such technology can be achieved by the silicidation of source/drain or self-aligned silicidation. However, along with further down-sizing of chips, the junction of source/drain also becomes shallower; the thickness of silicidated layer on source/drain must be thin down accordingly to prevent leaky junction. For instance, the technology applied in 0.18 µm design rule requires junction thickness of less than 0.1 µm; the thickness of the source/drain silicide layer is probably only 0.01–0.04 µm. Such thin layer can be easily overetched during the contact opening while maintaining the uniformity and production, resulting in loss of function.

Consequently, effective measuring and monitoring of the etching progress on this source/drain silicidation layer in preventing overetching has become a critical issue. For chips processed by self-aligned silicidation, maintaining the intactness of the silicide layer on gate determines the gate function when applied in connection, making measurement and monitor of the intactness essential as well.

BACKGROUND TECHNIQUE

Based on the survey conducted by this invention, there is no existing electrical test structure up to date known to effectively and rapidly detect the extend of overetch on source/drain silicide layer during the contact opening. Presently, the only feasible method is to use scanner electronic microscope (SEM) or blank test wafer in simulating chip processing. However, SEM method is not precise enough, destructive and time consuming, making wafer-mapping rather difficult. Furthermore, the blank test wafer method not only requires additional test wafer and production procedures, substituting the actual wafer with a blank one can easily produce considerable error.

SUMMARY OF THE INVENTION

The novelty of this invention lies in the improvement on conventional van der Pauw structure or cross-bridge structure. By designing the contact opening mask to expose the centre of van der Pauw structure, the sheet resistance of the van der Pauw centre can be used to detect the corrosive extend of silicide layer during the contact opening.

The main objective of this invention is to unveil a production procedure that can monitor and measure the intactness of silicide layer at the source/drain/gate during contact opening through an electrical monitoring device that employs a modified van der Pauw structure or cross-bridge structure.

REFERENCE NUMBER OF THE ATTACHED DRAWINGS

101 . . . Diffusion Layer
102 . . . Contact Layer Opening
103 . . . Metal-1 Layer
w . . . Width
L . . . Length
201 . . . via Opening
202 . . . Metal-2 Layer

DESCRIPTION OF THE INVENTION

Figure 1A:
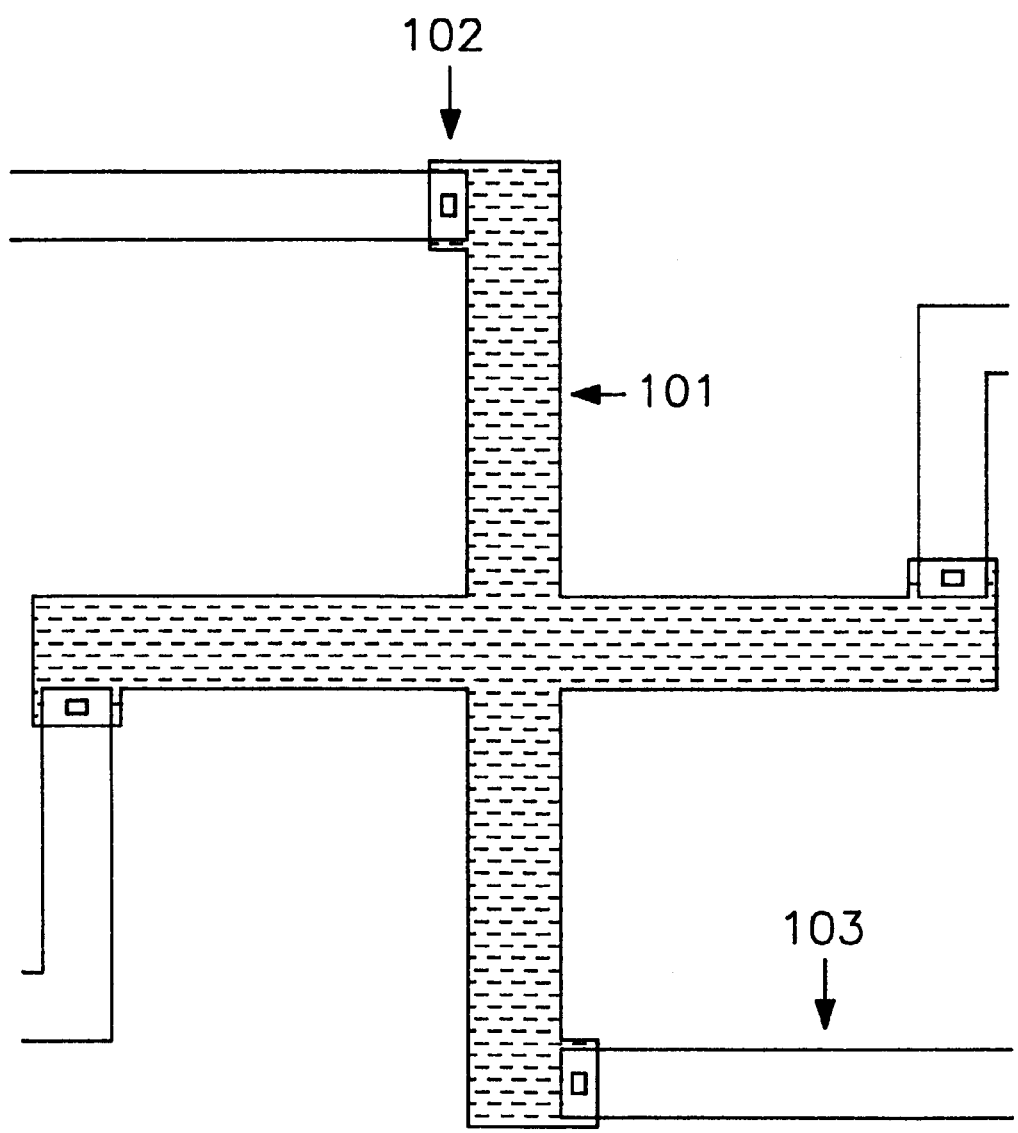
FIG. 1a schematically shows van der Pauw test structure
Figure 1B:
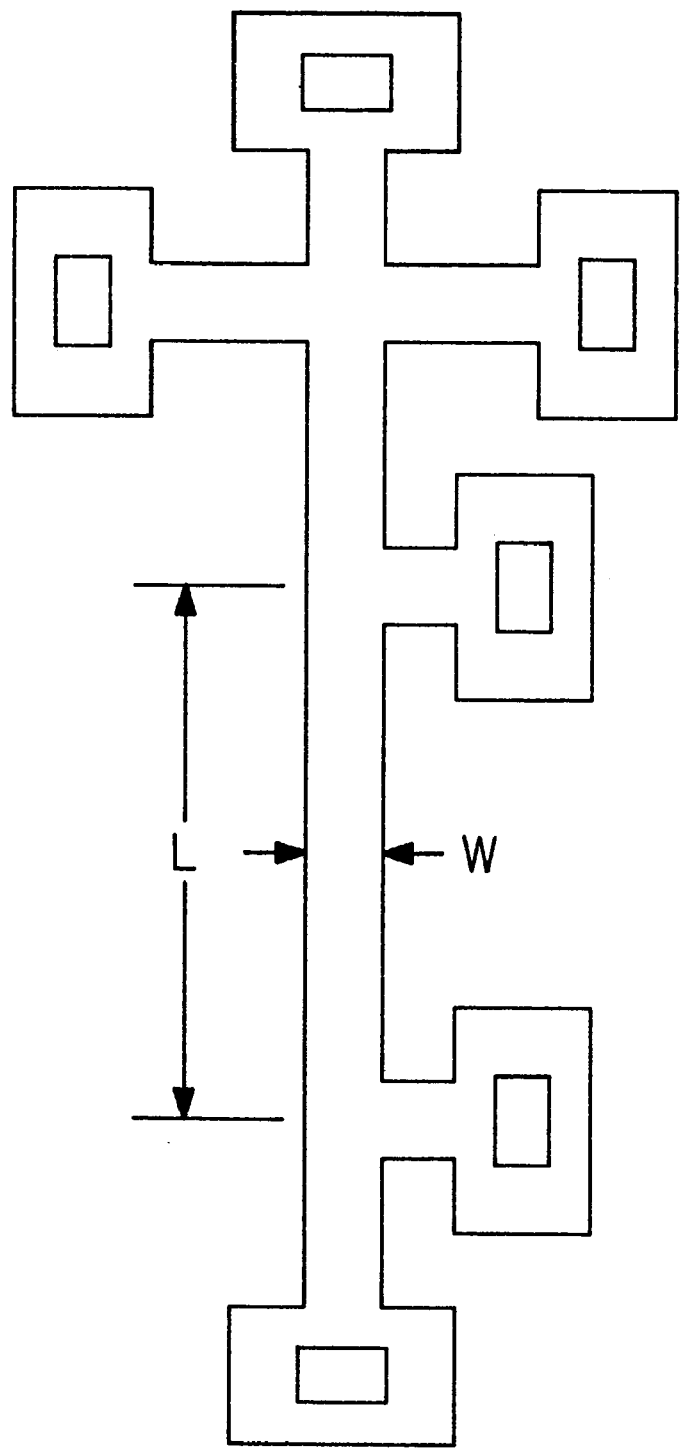
FIG. 1b schematically shows Cross-bridge structure

The principle of "the Electrical Detecting Method in Monitoring the Intactness of the Silicide layer on Source/Drain/Gate during Contact Layer Opening" of this invention is simple and practical. It is derived from the conventional van der Pauw test structure as shown in FIG. 1a or the cross-bridge structure as shown in FIG. 1b. Based on 1978 J. Electrochemical Society, 125 Issue, pp.645–650 and pp. 650–654 as shown in FIG. 1a documented by M. G. Buehler and etc, van der Pauw test structure can be applied to measure the sheet resistance of the conductor layer in deriving its thickness. The relevant contents lie in the four(4) contact holes at the 4 ends of the van der Pauw test structure which can be used for connecting with external wires. These four wires can be separately connected to voltage meter and current meter in deriving the sheet resistance of the van der Pauw centre. In addition, the cross-bridge structure, as the name suggests, contains a van der Pauw and a bridge. The essence of this method is to measure the sheet resistance on the van der Pauw, then bring the sheet resistance value to the bridge to derive the line width. Nevertheless, the sheet resistance derived, either through conventional van der Pauw or cross-bridge structure, includes the central region of the van der Pauw. This area, however, is completely protected by the insulation layer when contact opening is executed, making it impossible to detect the corrosive state of silicide layer.

The key feature of this invention lies in the improvement on the contact opening mask design of the conventional van der Pauw structure or cross-bridge structure by exposing the centre of the van der Pauw, rendering this area exposed when etching the contact openings. Consequently, the sheet resistance of the van der Pauw centre can be applied to detect the corrosive state of the silicide layer during contact opening.

"The Electrical Detecting Method in Monitoring the Intactness of the Silicide layer on Source/Drain/Gate during Contact Layer Opening" of this invention is an electrical detecting device derived from improving on the van der Pauw structure or cross-bridge structure which includes:

a) the van der Pauw or cross-bridge structure respectively is a diffusion layer(i,e., active layer) or poly gate layer;

b) the contact mask of the van der Pauw or cross-bridge structure is designed to completely expose the entire van der Pauw or cross-bridge structure so that it is exposed during etching of contact opening, rendering the silicide layer on the diffusion layer the same as overetched conditions of the source/drain contact opening in detecting the extend of silicide overetch;

c) the external connecting wires of the van der Pauw or cross-bridge structure is channeled out through via layer and Metal-2 for measuring the sheet resistance in deriving the thickness of silicide layer after contact overetch;

d) during the process monitoring, the monitor wafer and product wafer together may commence from the wafer start till the completion of contact overetch. The additional deposition layer on the monitor wafer(Remark: such as 100 nm) might be far thinner than the passivation layer; place it back with the product wafer for the remaining processes.

Certain non-critical production procedures for the monitor wafer may be eliminated such as Vth implant, LDD/halo implant, p+ source/drain implant.

The principles of this invention can be applied in detecting the intactness of silicide layer. Take measuring the silicide layer of source/drain area as an example, the formation and boundary of the diffusion layer are the same as the conventional van der Pauw structure. The following step in wafer production remains the same as commonly practiced until the photolithographic masking and etching of contact opening.

Figure 2A:
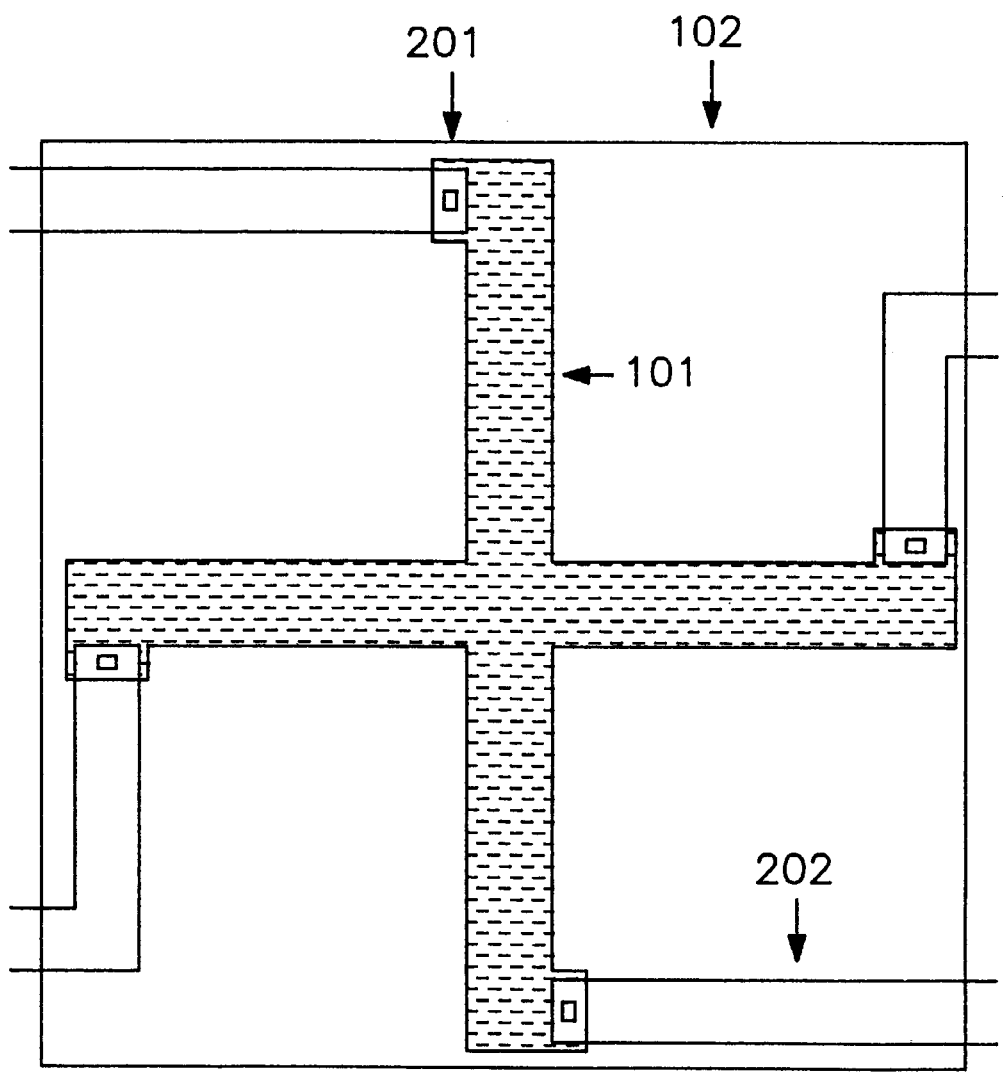
FIG. 2a schematically shows Version 1 of present invention
Figure 2B:
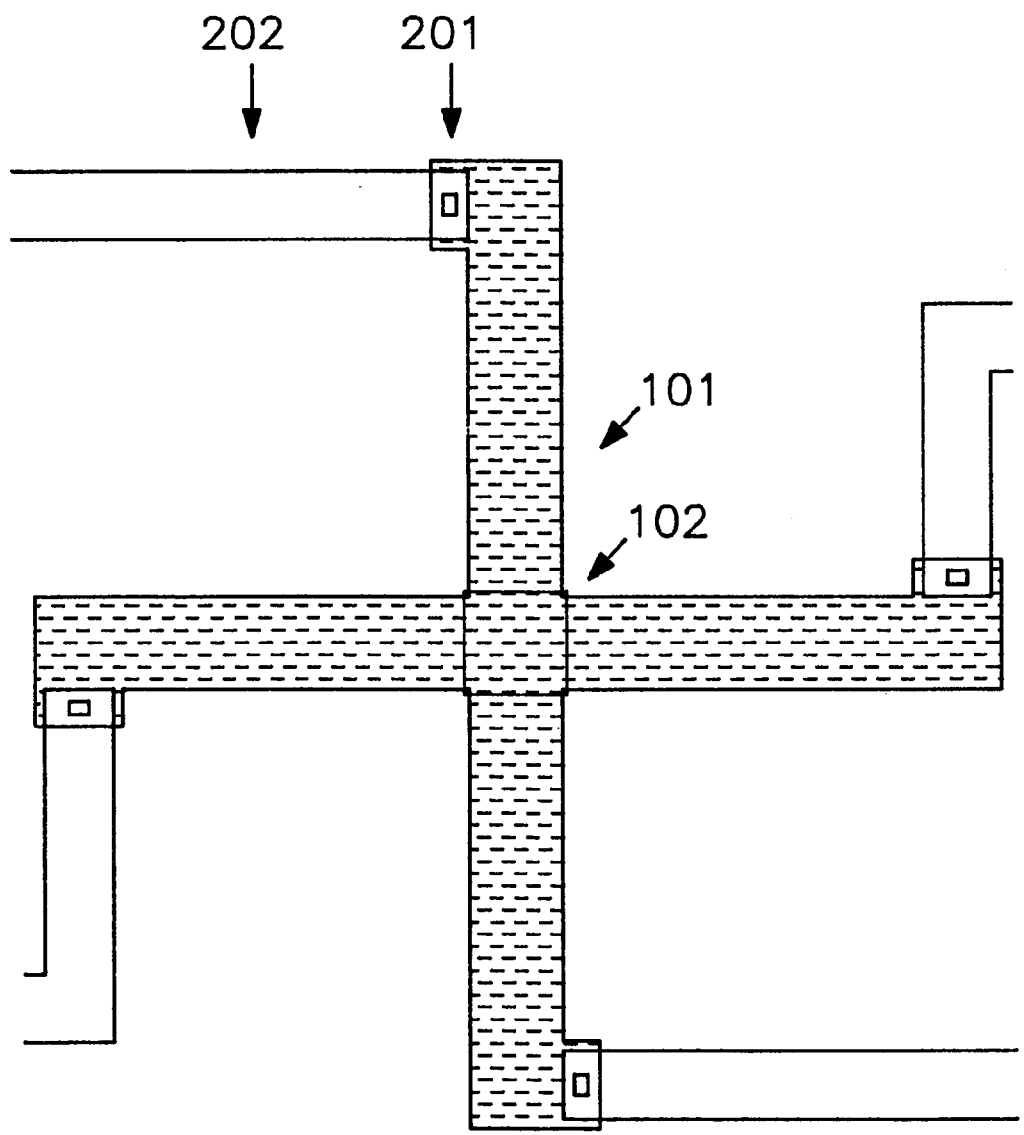
FIG. 2b schematically shows Version 2 of present invention

As described before, the difference of this invention from the conventional van der Pauw or cross-bridge structure lies in the different photoresist mask design of the contact opening mask. In the conventional van der Pauw structure, the photoresist pattern of contact openings is designed in exposing the 4 contact holes for external wiring as shown in FIG, 1a. The photoresist mask design of this invention can be a completely exposed van der Pauw structure as shown in FIG. 2a, Version 1 or a small contact opening that exposes the centre of van der Pauw structure (referring to the centre of the van der Pauw structure as shown in FIG. 2b, Version 2). Thus, the exposed area can faithfully simulate the corrosive extend of the source/drain silicide layer when etching the contact openings. For Version 2, the remaining processes are the same as the conventional production procedure with the only one caution which is to ensure that the centre of the van der Pauw shall be completely exposed when designing the photoresist mask for Metal-1 so that the deposited metal layer can be removed during the etching of Metal-1 to prevent erroneous judgment of source/drain silicide layer monitoring function. The four(4) contact openings for external electrical connection can be designed on the via-opening mask.

In other words, Version-2 can be used as on-wafer monitor for product wafer which can be designed on the normal production wafer in a compatible manner.

For Version-1, a thinner insulation can be deposited after the etching of contact opening whereas the four contact openings for external connection can be designed on the via-opening mask and connected with external wires through Metal-2.

Both prescribed versions can be applied in process monitor wafer in eliminating many production steps. For instance, the threshold implant, channel stop implant, S/D Implant, LDD/halo implants can be selectively eliminated without affecting the functions of routine production wafer monitoring. Naturally, due cautions shall be heeded in the possible effects on the ion implant density on silicide layer formation.

For instance, if the known density of arsenic ions is greater than $10^{15}$ cm$^{-2}$, it can retard the formation of TiSi$_2$.

Therefore, certain factors should be taken into account in eliminating production steps; calibration shall be made when necessary.

This invention is an electrical detecting method which can be a modified van der Pauw structure or cross-bridge structure and is capable of monitoring and measuring the intactness of the silicide layer on the source/drain/gate during the etching of contact layer openings, the advantages of this invention include:

1. Novelty: The first method ever to suggest using a simple and rapid electrical detecting method to monitor and measure the intactness of the silicide layer on the source/drain/gate during the etching of contact openings.
2. Progress: The prescribed method is more convenient, rapid and precise than the conventional methods.
3. Practicality: The method can be immediately applied in the production of integrated circuits with the benefits of enhancing production reliability as well as quality product; furthermore, it can also be designed into an on-wafer monitor without additional mask and production steps.

What is claimed is:

1. A method of measuring a degree of overetching of a silicide layer on a semiconductor wafer, comprising:

forming a van der Pauw or cross-bridge structure on the wafer;

forming a silicide layer over the van der Pauw or cross-bridge structure;

subjecting the silicide layer over the van der Pauw or cross-bridge structure to a photolithographic etching process, which process includes masking a photoresist layer on the silicide layer such that, when the photoresist layer is etched in the lithographic process, the silicide layer over at least a portion of the center of the van der Pauw or cross-bridge structure is etched; and measuring the electrical characteristics of the van der Pauw or cross-bridge structure to determine a degree of overetching of a silicide layer.

2. A method of measuring a degree of overetching of a silicide layer as recited in claim 1, wherein the photolithographic etching process includes masking a photoresist layer on the silicide layer such that, when the photoresist layer is etched in the lithographic process, the silicide layer over the entire van der Pauw or cross-bridge structure is etched.

3. A method of measuring a degree of overetching of a silicide layer as recited in claim 1, wherein the van der Pauw or cross-bridge structure is formed in the semiconductor wafer by a diffusion layer or a polygate layer.

* * * * *